US011061221B2

United States Patent
Kaupmann

(10) Patent No.: US 11,061,221 B2
(45) Date of Patent: Jul. 13, 2021

(54) MICROMECHANICAL COMPONENT, METHOD FOR MANUFACTURING A MICROMECHANICAL COMPONENT, AND METHOD FOR EXCITING A MOVEMENT OF AN ADJUSTABLE PART ABOUT A ROTATIONAL AXIS

(71) Applicant: Robert Bosch GmbH, Stuttgart (DE)

(72) Inventor: Philip Kaupmann, Gundelfingen (DE)

(73) Assignee: Robert Bosch GmbH, Stuttgart (DE)

( * ) Notice: Subject to any disclaimer, the term of this patent is extended or adjusted under 35 U.S.C. 154(b) by 238 days.

(21) Appl. No.: 16/153,030

(22) Filed: Oct. 5, 2018

(65) Prior Publication Data
US 2019/0121123 A1   Apr. 25, 2019

(30) Foreign Application Priority Data
Oct. 5, 2017   (DE) .......................... 102017217653.9

(51) Int. Cl.
G02B 26/08   (2006.01)
G02B 26/10   (2006.01)
(Continued)

(52) U.S. Cl.
CPC ....... G02B 26/0858 (2013.01); F16M 11/125 (2013.01); F16M 11/18 (2013.01);
(Continued)

(58) Field of Classification Search
CPC .......... B81B 2201/03; B81B 2201/032; B81B 2201/034; B81B 2201/04–047; B81B 3/0083; B81B 3/0086; B81B 2203/04; H01L 41/08–082; H01L 41/083–0838; H01L 41/09–0993; G02B 26/0841;
(Continued)

(56) References Cited

U.S. PATENT DOCUMENTS 6,379,510 B1 *   4/2002   Kane ................... B81C 1/00142
                                                        204/192.27
7,969,637 B1 *   6/2011   Fu ....................... G02B 26/0841
                                                        359/224.1
(Continued)

FOREIGN PATENT DOCUMENTS

| DE | 102008043796 A1 | 5/2010 |
|---|---|---|
| DE | 102012219591 A1 | 4/2014 |
| EP | 1806613 B1 | 8/2008 |

*Primary Examiner* — Christopher Stanford
(74) *Attorney, Agent, or Firm* — Norton Rose Fulbright US LLP; Gerard Messina

(57) ABSTRACT

A micromechanical component, including an adjustable part that is connected, at least via springs, to the mounting, and an actuator device with which a first oscillating motion of the adjustable part is excitable about a first rotational axis and at the same time a second oscillating motion of the adjustable part is excitable about a second rotational axis. The actuator device includes four piezoelectric bending actuators, and the adjustable part is settable into the first oscillating motion and/or into the second oscillating motion by deformation of the four piezoelectric bending actuators, and each of the four piezoelectric bending actuators at its first end is anchored to the mounting, and the adjustable part is suspended, at least via the springs, on the four piezoelectric bending actuators.

10 Claims, 3 Drawing Sheets

(51) Int. Cl.
*F16M 11/18* (2006.01)
*H02N 2/10* (2006.01)
*F16M 11/12* (2006.01)
*H01L 41/09* (2006.01)

(52) U.S. Cl.
CPC ............. *G02B 26/10* (2013.01); *H02N 2/108* (2013.01); *H01L 41/094* (2013.01)

(58) Field of Classification Search
CPC .............. G02B 26/085; G02B 26/0858; G02B 26/033; G02B 26/101; G02B 26/105; G02B 26/0833
See application file for complete search history.

(56) References Cited

U.S. PATENT DOCUMENTS

| | | | | |
|---|---|---|---|---|
| 8,624,686 B2* | 1/2014 | Sattler | ...................... | B81B 3/004 331/154 |
| 8,687,255 B2* | 4/2014 | Finkbeiner | .......... | B81C 1/00166 359/224.1 |
| 8,717,652 B2* | 5/2014 | Takahashi | .......... | G02B 26/0858 359/198.1 |
| 8,736,934 B2* | 5/2014 | Pinter | .................. | B81B 3/0043 359/199.1 |
| 9,843,779 B2* | 12/2017 | Giusti | .................. | G02B 7/1821 |
| 2004/0061417 A1* | 4/2004 | Hwang | .............. | G02B 26/0858 310/324 |
| 2005/0185239 A1* | 8/2005 | Orcutt | ..................... | B81B 3/007 359/199.1 |
| 2010/0245966 A1* | 9/2010 | Yasuda | ................ | H01L 41/0953 359/224.1 |
| 2011/0141441 A1* | 6/2011 | Konno | ................. | H04N 9/3129 353/69 |
| 2011/0141538 A1* | 6/2011 | Mizumoto | .......... | G02B 26/0841 359/224.1 |
| 2013/0208330 A1* | 8/2013 | Naono | ............... | G02B 26/0858 359/200.1 |
| 2014/0320943 A1* | 10/2014 | Oyama | .............. | G02B 26/0858 359/198.1 |
| 2015/0362724 A1* | 12/2015 | Ikegami | ............. | G02B 26/0858 359/199.4 |
| 2017/0205624 A1* | 7/2017 | Naono | .................. | B81B 3/0043 |
| 2018/0039074 A1* | 2/2018 | Oyama | .............. | H01L 41/0946 |
| 2019/0121121 A1* | 4/2019 | Galinski, III | ......... | H01L 41/042 |

\* cited by examiner

MICROMECHANICAL COMPONENT, METHOD FOR MANUFACTURING A MICROMECHANICAL COMPONENT, AND METHOD FOR EXCITING A MOVEMENT OF AN ADJUSTABLE PART ABOUT A ROTATIONAL AXIS

RELATED APPLICATION INFORMATION

The present application claims priority to and the benefit of German patent application no. 10 2017 217 653.9, which was filed in Germany on Oct. 5, 2017, the disclosure which is incorporated herein by reference.

FIELD OF THE INVENTION

The present invention relates to a micromechanical component. Moreover, the present invention relates to a method for manufacturing a micromechanical component. Furthermore, the present invention relates to a method for exciting a movement of an adjustable part about a rotational axis.

BACKGROUND INFORMATION

Patent document DE 10 2012 219 591 A1 discusses a micromechanical component that includes an adjustable part that is connected to a mounting via springs. In addition, on each spring the micromechanical component includes at least one attached bending actuator whose shape is changeable, by provision of at least one electrical signal, in such a way that the adjustable part is adjustable into a movement about a rotational axis via a restoring force that results from the deformation of the bending actuators. Furthermore, the adjustable part is configured to be additionally adjustable about a further rotational axis with the aid of at least one further actuator.

SUMMARY OF THE INVENTION

The present invention provides a micromechanical component having the features described herein, a method for manufacturing a micromechanical component having the features described herein, and a method for exciting a movement of an adjustable part about a rotational axis, having the features described herein.

The present invention provides options that are advantageously suitable for effectuating a movement/oscillating motion of the adjustable part about a rotational axis (oriented perpendicularly with respect to the first rotational axis and the second rotational axis), making use of gyroscopic effects. Such an excitation of the movement/oscillating motion of the adjustable part about the rotational axis is generally more energy-efficient than conventional drives. In particular, the four piezoelectric bending actuators of the actuator device according to the present invention require only comparatively low excitation voltages, for which reason their operation is more energy-efficient than a conventional electrostatic drive. In addition, when the present invention is utilized instead of an electromagnetic drive, the traditional need for connecting at least one permanent magnet and/or at least one coil to the adjustable part is dispensed with. The present invention thus also facilitates minimization of micromechanical components and thus contributes to an increase in options for their use.

The adjustable part may be suspended, at least via the springs, on the four piezoelectric bending actuators in such a way that the adjustable part is adjustable, in relation to the mounting, about a rotational axis that is oriented perpendicularly with respect to the first rotational axis and perpendicularly with respect to the second rotational axis, with the aid of a torque that results from an excitation of the adjustable part, set into the first oscillating motion, into the second oscillating motion. In this way, the adjustable part may be rotated about the rotational axis, even when a "direct excitation" of a rotation of the adjustable part about the rotational axis is energetically inefficient or hardly/not achievable.

In one advantageous specific embodiment of the micromechanical component, the actuator device is configured in such a way that the adjustable part is settable into a first resonant oscillating motion as the first oscillating motion, and at the same time is settable into a second resonant oscillating motion as the second oscillating motion, in such a way that the adjustable part is settable into a static oscillating motion about the rotational axis with the aid of the resulting torque. The present invention thus allows a static/quasi-static deflection of the adjustable part about the rotational axis via purely resonant excitations (making use of gyroscopic effects). The energy efficiency of the first resonant oscillating motion and of the second resonant oscillating motion may thus be utilized for the static/quasi-static deflection of the adjustable part about the rotational axis.

In addition, the first piezoelectric bending actuator and the second piezoelectric bending actuator may extend in succession along a first axis oriented in parallel to the rotational axis, and the third piezoelectric bending actuator and the fourth piezoelectric bending actuator may extend in succession along a second axis oriented in parallel to the rotational axis, the adjustable part and the springs being situated between the first axis and the second axis. Such a configuration of the components of the micromechanical component stated here is comparatively space-saving, and thus facilitates minimization of the micromechanical component.

The adjustable part may include a mirror plate having a reflective surface, the adjustable part being settable into the first oscillating motion about the first rotational axis, oriented perpendicularly with respect to the reflective surface, and at the same time being settable into the second oscillating motion, or being settable into the first oscillating motion and at the same time being settable into the second oscillating motion about the second rotational axis oriented perpendicularly with respect to the reflective surface. If the first rotational axis is oriented perpendicularly with respect to the reflective surface, the second oscillating motion and the adjustment movement of the adjustable part about the rotational axis may be used to scan a surface. (In this case, the first oscillating motion has little or no influence on a light beam that is reflected on the reflective surface.) Similarly, if the second rotational axis is oriented perpendicularly with respect to the reflective surface, the first oscillating motion and the adjustment movement of the adjustable part about the rotational axis may be used to scan a surface. (In this case, the second oscillating motion has little or no influence on the reflected light beam.) The specific embodiment of the micromechanical component described here is thus advantageously suited for a scanner or a projector. In particular, the specific embodiment described here is suitable for virtual reality glasses or data glasses.

For example, the micromechanical component may include at least one inner spring, at least one intermediate spring, and four outer springs as the at least one spring, and the adjustable part may be connected, at least via the at least one inner spring, to an inner intermediate frame, the inner intermediate frame may be connected, at least via the at least one intermediate spring, to an outer intermediate frame, and the outer intermediate frame may be suspended, via the four outer springs, on the four piezoelectric bending actuators. Suspending the adjustable part in such a way that the adjustable part is (resonantly) adjustable about the first rotational axis, (resonantly) adjustable about the second rotational axis, and (statically/quasi-statically) adjustable about the rotational axis is thus easily and reliably achievable.

In one advantageous refinement, the actuator device also includes at least one further piezoelectric bending actuator that is attached to the adjustable part, to the inner intermediate frame, and/or to the outer intermediate frame, the adjustable part being settable, in relation to the mounting, into the first oscillating motion about the first rotational axis by deformation of the four piezoelectric bending actuators, and being settable into the second oscillating motion about the second rotational axis by deformation of the at least one further piezoelectric bending actuator, or being settable into the first oscillating motion about the first rotational axis by deformation of the at least one further piezoelectric bending actuator, and being settable into the second oscillating motion about the second rotational axis, by deformation of the four piezoelectric bending actuators. Alternatively, the adjustable part may be settable, in relation to the mounting, into the first oscillating motion about the first rotational axis, and settable into the second oscillating motion about the second rotational axis, by deformation of the four piezoelectric bending actuators. The specific embodiments of the micromechanical component described in this paragraph thus include an actuator device that is based completely on piezoelectric elements, for which no permanent magnets, coils, or electrode devices are necessary.

The advantages described above are also achievable by carrying out a corresponding method for manufacturing a micromechanical component. It is pointed out that the manufacturing method may be refined according to the above-described specific embodiments of the micromechanical component.

In addition, carrying out a corresponding method for exciting a movement of an adjustable part about a rotational axis achieves the advantages explained above. Furthermore, the method for exciting a movement of an adjustable part about a rotational axis may be refined according to the specific embodiments of the micromechanical component explained above.

Further features and advantages of the present invention are explained below with reference to the figures.

DETAILED DESCRIPTION

Figure 1A:
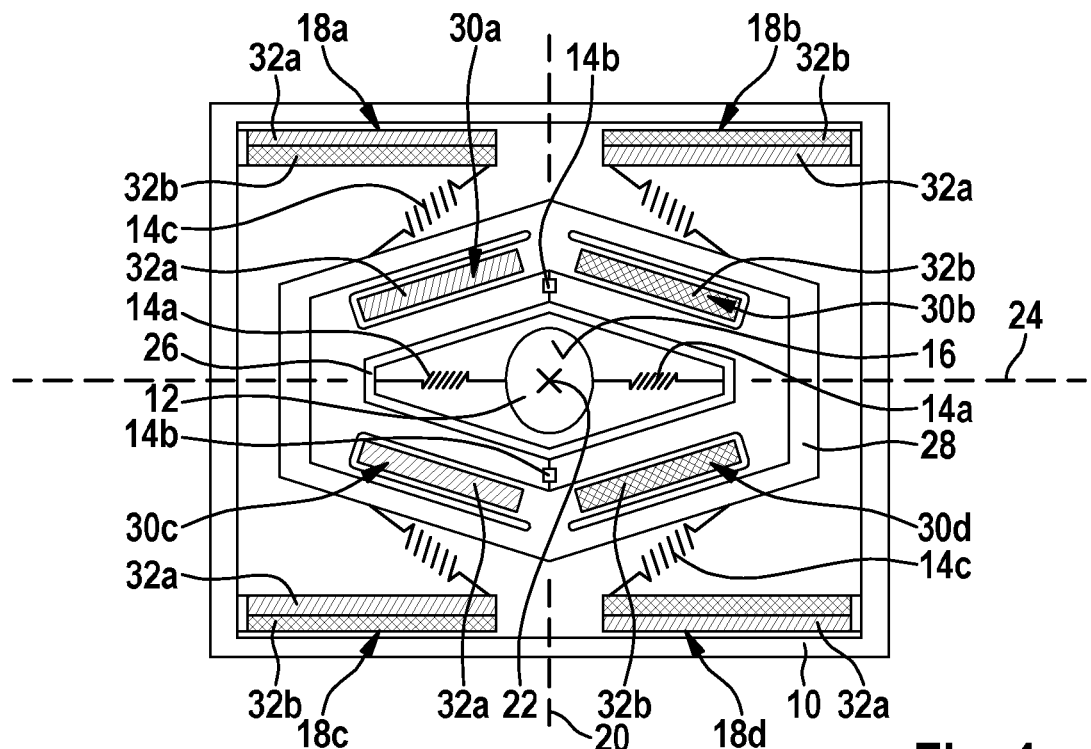
FIGS. 1a and 1b show schematic illustrations for explaining an operating principle of a first specific embodiment of the micromechanical component.
Figure 1B:
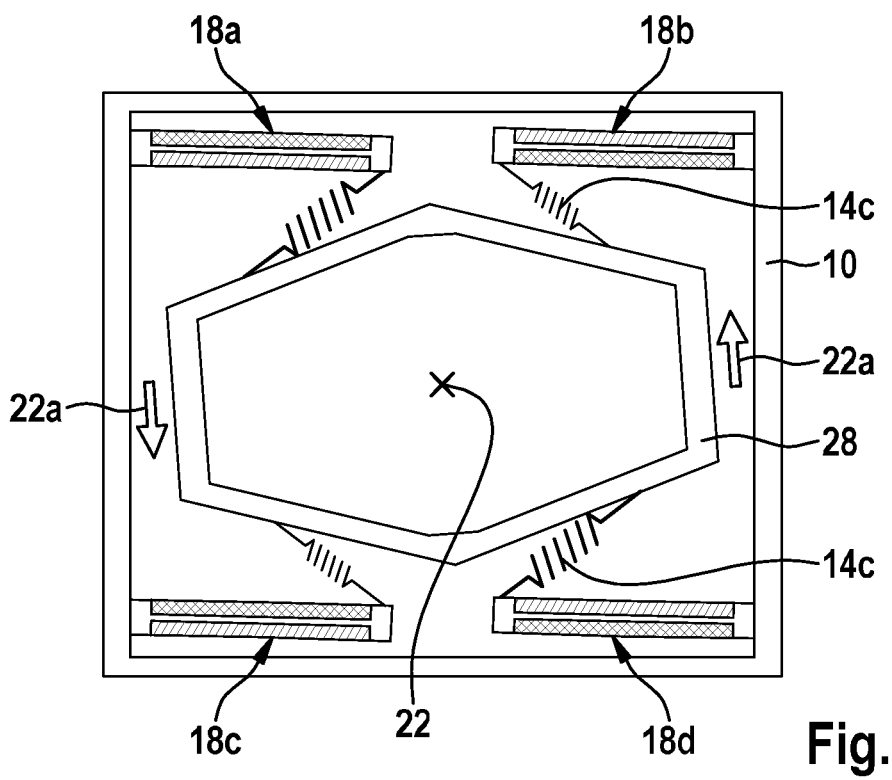

FIGS. 1a and 1b show schematic illustrations for explaining an operating principle of a first specific embodiment of the micromechanical component.

The micromechanical component schematically illustrated in FIG. 1a includes a mounting 10 and an adjustable part 12, adjustable part 12 being connected, at least via springs 14a through 14c, to mounting 10. As an example, adjustable part 12 is a mirror plate 12 having a reflective surface 16. However, it is pointed out that a configuration of adjustable part 12 is not limited to the example depicted in FIG. 1a.

The micromechanical component also includes an (only partially depicted) actuator device 18a through 18d and 30a through 30d that is configured in such a way that a first oscillating motion of adjustable part 12 is excitable, in relation to mounting 10, about a first rotational axis 20 with the aid of actuator device 18a through 18d and 30a through 30d. At the same time (as the first oscillating motion of adjustable part 12 about first rotational axis 20) a second oscillating motion of adjustable part 12, set into the first oscillating motion, is excitable, in relation to mounting 10, about a second rotational axis 22 with the aid of actuator device 18a through 18d and 30a through 30d. Second rotational axis 22 is oriented at an angle with respect to first rotational axis 20. In particular, second rotational axis 22 may be oriented perpendicularly with respect to first rotational axis 20. (In the example in FIG. 1a, second rotational axis 22 is oriented perpendicularly with respect to the image plane.)

Actuator device 18a through 18d and 30a through 30d includes a first piezoelectric bending actuator 18a, a second piezoelectric bending actuator 18b, a third piezoelectric bending actuator 18c, and a fourth piezoelectric bending actuator 18d. Each of the four piezoelectric bending actuators 18a through 18d is anchored at its first end to mounting 10. Adjustable part 12 is suspended, at least via springs 14c (referred to as outer springs 14c), on the four piezoelectric bending actuators 18a through 18d. For example, each of the four piezoelectric bending actuators 18a through 18d at its second end (directed away from the first end) may be connected to an outer spring 14c, so that adjustable part 12, at least via the four outer springs 14c, is suspended on the four piezoelectric bending actuators 18a through 18d.

The four piezoelectric bending actuators 18a through 18d are deformable/deformed with the aid of at least one electrical signal applied thereto. Adjustable part 12 is settable/set, in relation to mounting 10, into the first oscillating motion about first rotational axis 20 and/or into the second oscillating motion about second rotational axis 22 by deformation of the four piezoelectric bending actuators 18a through 18d.

Due to the simultaneous excitation of the first oscillating motion of adjustable part 12 about first rotational axis 20, and the second oscillating motion of adjustable part 12 about second rotational axis 22, an angular momentum of adjustable part 12 directed about first rotational axis 20 is disturbed by a further angular momentum of adjustable part 12 directed about second rotational axis 22. A torque thus results from the excitation of adjustable part 12, set into the first oscillating motion (about first rotational axis 20), into the second oscillating motion (about second rotational axis 22). The resulting torque is directed orthogonally with respect to first rotational axis 20 and orthogonally with respect to second rotational axis 22. A magnitude of the resulting torque is proportional to the product of a first angular velocity of the first oscillating motion of adjustable part 12 about first rotational axis 20 and a second angular velocity of the second oscillating motion of adjustable part 12 about second rotational axis 22. In addition, adjustable part 12 is adjustably suspended, at least via springs 14a through 14c, on the four piezoelectric bending actuators 18a through 18d in such a way that adjustable part 12 is adjustable/adjusted, in relation to mounting 10, about a rotational axis 24 that is oriented perpendicularly with respect to first rotational axis 20 and oriented perpendicularly with respect to second rotational axis 22, with the aid of the resulting torque.

The micromechanical component described here thus allows an adjustment of adjustable part 12 about rotational axis 24 by an excitation of the first oscillating motion about rotational axis 20, and of the second oscillating motion about second rotational axis 22. The micromechanical component may therefore be used in a variety of ways due to the advantageous adjustability of adjustable part 12.

The magnitude of the torque that results from the first oscillating motion and the second oscillating motion is proportional to the product of the first angular velocity of the first oscillating motion and the second angular velocity of the second oscillating motion. Therefore, the magnitude of the resulting torque is at a maximum when the first oscillating motion about first rotational axis 20 and the second oscillating motion about second rotational axis 22 are excited in phase (i.e., with a phase difference of 0°) or in phase opposition (i.e., with a phase difference of 180°). Similarly, the magnitude of the resulting torque is at a minimum when a phase difference of 90° or 270° is present between the first oscillating motion about first rotational axis 20 and the second oscillating motion about second rotational axis 22.

A frequency of an oscillating motion of adjustable part 12 about rotational axis 24 is a function of a first drive frequency of the first oscillating motion (about first rotational axis 20) and a second drive frequency of the second oscillating motion (about second rotational axis 22). The first drive frequency and the second drive frequency may be selected corresponding to the desired resulting frequency of the oscillating motion of adjustable part 12 about rotational axis 24. When the first drive frequency and the second drive frequency are exactly superimposed, an arbitrary frequency of the oscillating motion of adjustable part 12 about rotational axis 24 may thus be generated by modulating a first amplitude of the first oscillating motions and/or a second amplitude of the second oscillating motions.

In particular, actuator device 18a through 18d and 30a through 30d may be configured in such a way that adjustable part 12 is settable/set into a first resonant oscillating motion (about first rotational axis 20) as the first oscillating motion, and at the same time, into a second resonant oscillating motion (about second rotational axis 22) as the second oscillating motion, in such a way that adjustable part 12 is settable/set into a static (quasi-static) oscillating motion about rotational axis 24 with the aid of the resulting torque. The static (quasi-static) oscillating motion of the adjustable part about rotational axis 24 may thus be achieved with the aid of a (purely) resonant excitation of the first oscillating motion and the second oscillating motion of the adjustable part. Resonant oscillating motions may generally be driven with low power, whereas according to the related art, a (direct) excitation of a static/quasi-static movement always requires a directed force that deforms at least one conventional spring element. To reduce the power that is to be applied for effectuating the directed force that is generally required, it is believed to be understood from the related art only to provide in each case at least one conventional spring element to be "soft," which increases its susceptibility to breakage. In addition, in conventional piezoresistive or electrostatic drive configurations the problem often arises that, despite effectuating a high force, sufficient deflection is not achieved due to the fact that travel paths of the drive configurations are too short.

However, the specific embodiment of the micromechanical component described here does not require the directed force that is conventionally necessary for (directly) exciting the static/quasi-static movement. Instead, the advantages of the resonant excitation of the first oscillating motion about first rotational axis 20 and of the second oscillating motion about second rotational axis 22 may be utilized for the static (quasi-static) oscillating motion of adjustable part 12 about rotational axis 24, which has advantageous effects on an achieved deflection, power consumption, size, and manufacturing costs of the micromechanical component.

The first resonant oscillating motion of adjustable part 12 about first rotational axis 20 and the second resonant oscillating motion of adjustable part 12 about second rotational axis 22 may have the same natural frequencies. However, the first resonant oscillating motion of adjustable part 12 about first rotational axis 20 may also have a first natural frequency that differs from a second resonant natural frequency of the second oscillating motion of adjustable part 12 about second rotational axis 22.

The advantageous adjustability of adjustable part 12 thus allows an adjustment of its reflective surface 16 about a "fast" resonant axis (first rotational axis 20) and about a "slow" quasi-static axis (rotational axis 24). The gyroscopic effect is utilized for effectuating the quasi-static deflection of reflective surface 16. Static retaining forces may thus be dispensed with, and the excitation may take place purely resonantly. This is more energy-efficient than a quasi-static deflection by an electrostatic drive or an electromagnetic drive, and has advantageous effects on power consumption, a minimal size, and manufacturing costs of the micromechanical component. As explained in greater detail below, these advantages may be achieved solely by piezoelectrically-based actuator device 18a through 18d and 30a through 30d, without the need for an additional electrostatic drive and/or an additional electromagnetic drive for actuator device 18a through 18d and 30a through 30d.

As an example, the micromechanical component in FIG. 1a also includes at least one inner spring 14a and at least one intermediate spring 14b together with the four outer springs 14c as springs 14a through 14c. Adjustable part 12 is connected, at least via the at least one inner spring 14a, to an inner intermediate frame 26. Inner intermediate frame 26 is connected, at least via the at least one intermediate spring 14b, to an outer intermediate frame 28. Outer intermediate frame 28 is suspended, via the four outer springs 14c, on the four piezoelectric bending actuators 18a through 18d.

In the specific embodiment in FIGS. 1a and 1b, adjustable part 12 is settable into the second (resonant) oscillating motion about second rotational axis 22 by deformations of the four piezoelectric bending actuators 18a through 18d. As an example, second rotational axis 22 is oriented perpendicularly with respect to reflective surface 16. The second (resonant) oscillating motion about second rotational axis 22 may therefore be referred to as an "in-plane" rotation. The second (resonant) oscillating motion about second rotational axis 22 is schematically depicted in FIG. 1b (with omission of some components of the micromechanical component for the sake of better clarity.) Although the deformation of the four piezoelectric bending actuators 18a through 18d has a comparatively small amplitude in each case (generally less than 0.5 μm), the spring-mass system is resonantly set into vibration with high amplitudes, as illustrated by arrows 22a in FIG. 1b. The second resonant oscillating motion about second rotational axis 22 may thus have relatively high amplitudes.

Actuator device 18a through 18d and 30a through 30d, with the aid of which adjustable part 12 is settable into the first oscillating motion (about first rotational axis 20), and at the same time is settable into the second oscillating motion about second rotational axis 22 oriented perpendicularly with respect to reflective surface 16, may thus effectuate a deflection of a light beam, directed onto reflective surface 16, about first rotational axis 20 (with the aid of a resonant first oscillating motion), and a simultaneous deflection of the light beam about rotational axis 24 (with the aid of a static/quasi-static oscillating motion). (The second oscillating motion of adjustable part 12 about second rotational axis 22 has little or no influence on the light beam that is directed onto reflective surface 16.) The micromechanical component described here is thus usable in a variety of ways, for example in a scanner or a projector. This advantage is also present if first rotational axis 20 is oriented perpendicularly with respect to reflective surface 16, and adjustable part 12 is settable into the first oscillating motion (about first rotational axis 20 oriented perpendicularly with respect to reflective surface 16), and at the same time, into the second oscillating motion (about second rotational axis 22), with the aid of actuator device 18a through 18d and 30a through 30d.

In the specific embodiment in FIG. 1, actuator device 18a through 18d and 30a through 30d also includes at least one further piezoelectric bending actuator 30a through 30d that is attached to adjustable part 12, to inner intermediate frame 26, and/or to outer intermediate frame 28. Adjustable part 12 is settable, in relation to mounting 10, into the first oscillating motion about first rotational axis 20 by deformation of the at least one further piezoelectric bending actuator 30a through 30d (and at the same time is settable into the second oscillating motion about second rotational axis 22 by deformation of the four piezoelectric bending actuators 18a through 18d.) The first oscillating motion about first rotational axis 20 may be referred to as a "tilting movement" of adjustable part 12 or as an "out-of-plane" rotation of adjustable part 12.

Strictly by way of example, actuator device 18a through 18d and 30a through 30d in FIG. 1 includes four further piezoelectric bending actuators 30a through 30d, all of which are attached to outer intermediate frame 28. A first piezoelectric bending actuator 30a and a second piezoelectric bending actuator 30b of the four further piezoelectric bending actuators 30a through 30d have a mirror-symmetrical configuration with respect to first rotational axis 20, and each extends away from first rotational axis 20. Similarly, a third piezoelectric bending actuator 30c and a fourth piezoelectric bending actuator 30d of the four further piezoelectric bending actuators 30a through 30d have a mirror-symmetrical configuration with respect to first rotational axis 20, and likewise extend away from first rotational axis 20.

Each of piezoelectric bending actuators 18a through 18d and 30a through 30d is understood to mean an actuator whose shape is changeable by applying/providing at least one (time-variable) electrical signal in such a way that a restoring force that results from the deformation of the particular piezoelectric bending actuator 18a through 18d and 30a through 30d acts on adjustable part 12. For example, each piezoelectric bending actuator 18a through 18d and 30a through 30d may include at least one piezoelectric material 32a and 32b deposited on at least one support surface, and/or electrodes (not illustrated), for applying the at least one (time-variable) electrical signal. This type of piezoelectric bending actuator 18a through 18d and 30a through 30d is suited in particular for exciting the resonant first and second oscillating motions of adjustable part 12, since only a comparatively "short excitation path" is needed for exciting the resonant first and second oscillating motions.

The at least one piezoelectric material 32a and 32b may be lead zirconate titanate (PZT), for example. However, a configuration of piezoelectric bending actuators 18a through 18d and 30a through 30d is not limited to a specific piezoelectric material 32a and 32b. The at least one piezoelectric material 32a and 32b may be applied, for example, only to one edge of the support surface (for example, near contacted outer spring 14c). However, it is also possible for at least one entire face of the support surface to be coated with the at least one piezoelectric material 32a and 32b.

In the example in FIG. 1, first piezoelectric bending actuator 18a and second piezoelectric bending actuator 18b extend in succession along a first axis oriented in parallel to rotational axis 24. First piezoelectric bending actuator 18a and second piezoelectric bending actuator 18b are anchored (at their first ends) to mounting 10 in such a way that their second ends are oriented toward one another. Similarly, third piezoelectric bending actuator 18c and fourth piezoelectric bending actuator 18d extend in succession along a second axis oriented in parallel to rotational axis 24, (at their first ends) being anchored to mounting 10 in such a way that their second ends are oriented toward one another. Adjustable part 12, intermediate frames 26 and 28, and springs 14a, 14b, 14c are situated between the first axis and the second axis. The support surfaces of piezoelectric bending actuators 18a through 18d may each be configured as a linear lifting element or as a linear bending bar.

One first strip 30a and one second strip 30b, extending next to first strip 30a, and made of the at least one piezoelectric material 32a and 32b may be mounted on each support surface of piezoelectric bending actuators 18a through 18d, and are controlled in phase opposition in order to effectuate the planar deformation of piezoelectric bending actuators 18a through 18d illustrated in FIG. 1b. In addition, first (further) piezoelectric bending actuator 30a may be controlled in phase opposition to second (further) piezoelectric bending actuator 30b. Similarly, it is advantageous when third (further) piezoelectric bending actuator 30c is controlled in phase opposition to fourth (further) piezoelectric bending actuator 30d.

With regard to a configuration of piezoelectric bending actuators 18a through 18d and 30a through 30d, reference is also made to DE 10 2012 219 591 A1. A cost-effective, easily manufacturable type of actuator is thus usable for piezoelectric bending actuators 18a through 18d and 30a through 30d.

Piezoelectric bending actuators 18a through 18d and 30a through 30d may be controlled in such a way that the masses thus set in motion oscillate in phase opposition to exciting piezoelectric bending actuators 18a through 18d and 30a through 30d. In addition, mass elements may be mounted on piezoelectric bending actuators 18a through 18d and 30a through 30d in order to keep their amplitude comparatively small. Externally acting moments may be largely compensated for, so that only very low forces are exerted on mounting 10 itself.

Figure 2:
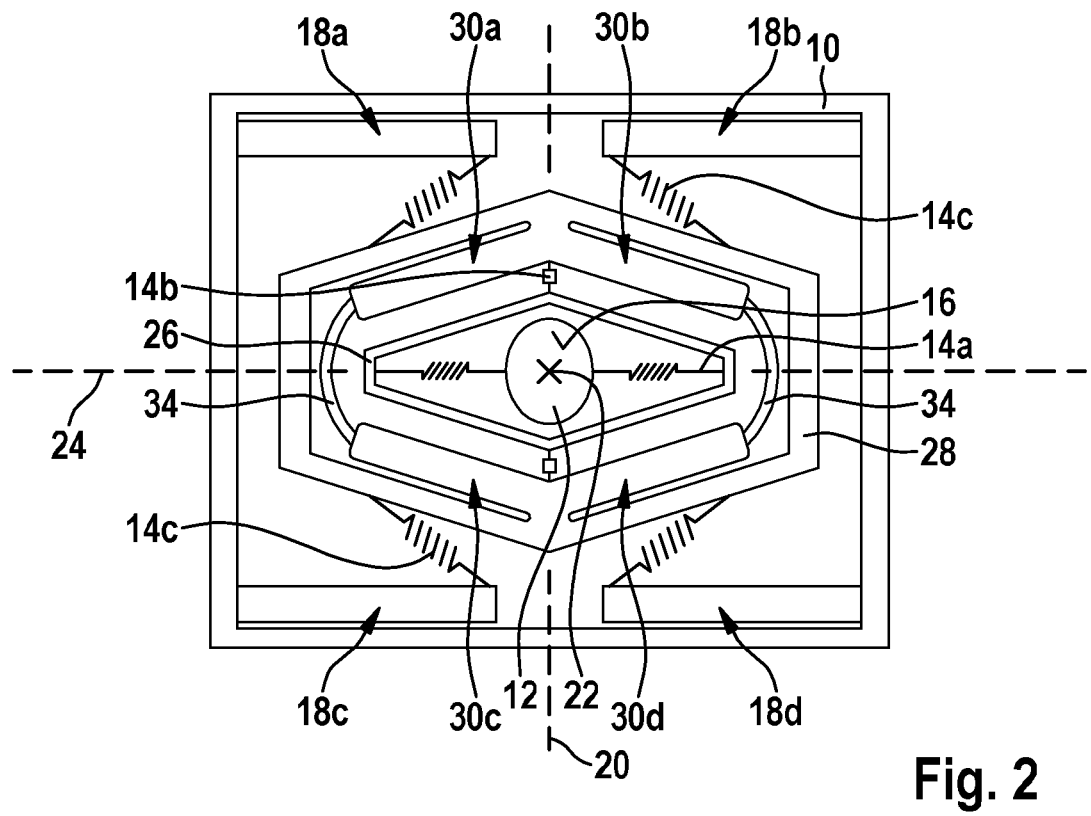
FIG. 2 shows a schematic illustration of a second specific embodiment of the micromechanical component.

FIG. 2 shows a schematic illustration of a second specific embodiment of the micromechanical component.

The micromechanical component schematically depicted in FIG. 2, as a refinement of the specific embodiment described above, also includes one coupling spring 34 each between two (further) piezoelectric bending actuators 30a and 30c/30b and 30d situated on the same side of first rotational axis 20. Coupling springs 34 may improve the robustness of the first oscillating motion about first rotational axis 20 against parasitic modes.

With regard to further features of the micromechanical component in FIG. 2, reference is made to the preceding specific embodiment.

Figure 3:
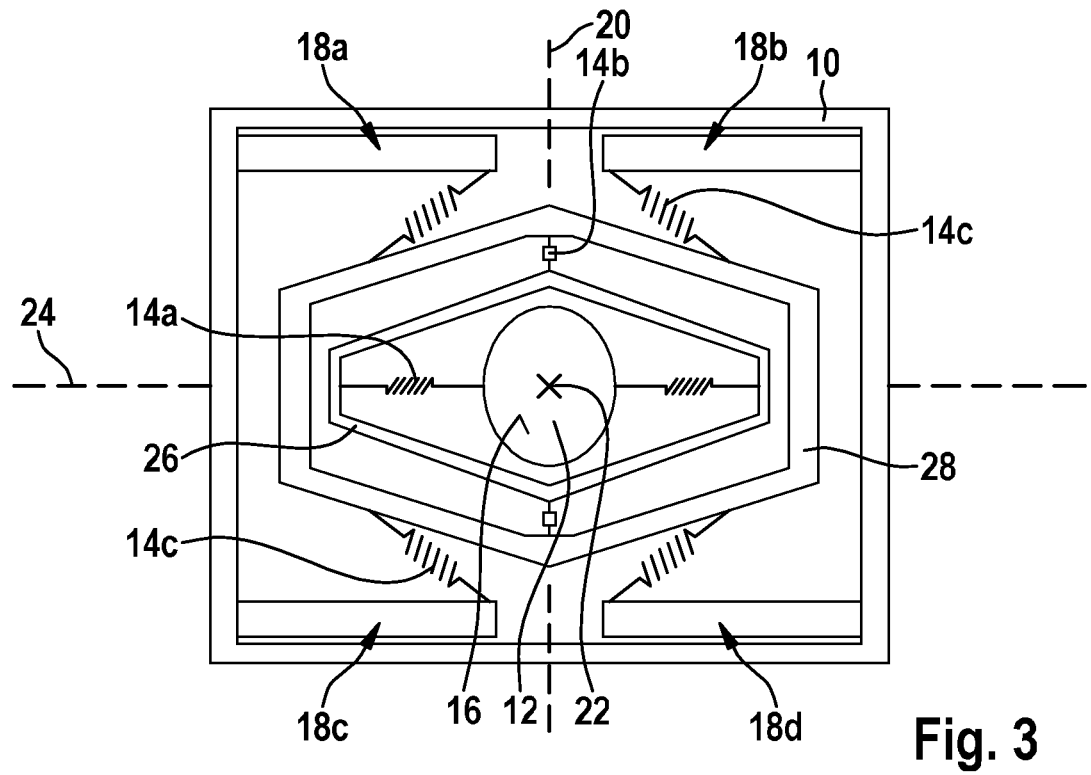
FIG. 3 shows a schematic illustration of a third specific embodiment of the micromechanical component.

FIG. 3 shows a schematic illustration of a third specific embodiment of the micromechanical component.

In the micromechanical component in FIG. 3, adjustable part 12 is settable, in relation to mounting 10, into the first oscillating motion about first rotational axis 20 as well as (simultaneously) settable into the second oscillating motion about second rotational axis 22 by deformation of the four piezoelectric bending actuators 18a through 18d. For this purpose, the four piezoelectric bending actuators 18a through 18d are controlled in such a way that, in addition to a deformation within the plane of components 10, 12, 14a through 14d, 26, and 28, in a further deformation movement they are also deflected out of the plane of components 10, 12, 14a through 14d, 26, and 28. This may take place with the aid of an electrical signal superimposition. The four piezoelectric bending actuators 18a through 18d are thus sufficient for effectuating the first oscillating motion about first rotational axis 20 and the second oscillating motion about second rotational axis 22. An additional drive, for example an additional piezoelectric drive, an additional electrostatic drive, and/or an additional electromagnetic drive, is therefore not necessary.

With regard to further features of the micromechanical component, reference is made to the specific embodiment in FIG. 1.

The micromechanical components described above may be used for projectors (data glasses or head-up displays, for example) or in scanner devices (for example, of sensors, in particular surroundings detection sensors) for two-dimensional scanning of a surface and/or three-dimensional scanning of a volume. However, usability of the micromechanical components is not limited to the stated examples.

Figure 4:
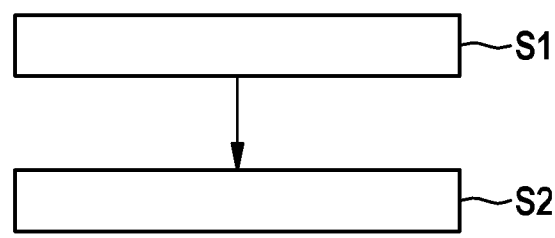
FIG. 4 shows a flow chart for explaining one specific embodiment of the method for manufacturing a micromechanical component.

FIG. 4 shows a flow chart for explaining one specific embodiment of the method for manufacturing a micromechanical component.

An adjustable part is connected, at least via springs, to a mounting in a method step S1. This takes place, for example, by structuring the adjustable part, the springs, and the mounting out of at least one semiconductor layer.

In a further method step S2, an actuator device is formed which is configured for exciting, in relation to the mounting, a first oscillating motion of the adjustable part about a first rotational axis and for simultaneously exciting, in relation to the mounting, a second oscillating motion of the adjustable part, set into the first oscillating motion, about a second rotational axis that is oriented at an angle with respect to the first rotational axis. The actuator device is equipped with a first piezoelectric bending actuator, a second piezoelectric bending actuator, a third piezoelectric bending actuator, and a fourth piezoelectric bending actuator, which are configured in such a way that the adjustable part is set, in relation to the mounting, into the first oscillating motion about the first rotational axis and/or into the second oscillating motion about the second rotational axis by deformation of the four piezoelectric bending actuators. In addition, each of the four piezoelectric bending actuators at its first end is anchored to the mounting, and the adjustable part is suspended, at least via the springs, on the four piezoelectric bending actuators.

Method steps S1 and S2 may be carried out in an arbitrary sequence or with temporal overlap. In addition, further features of the micromechanical components described above may be provided with the aid of the manufacturing method.

Figure 5:
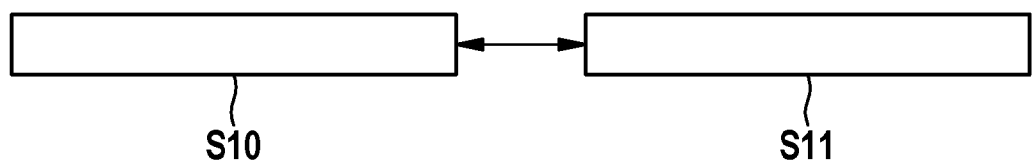
FIG. 5 shows a flow chart for explaining one specific embodiment of the method for exciting a movement of an adjustable part about a rotational axis.

FIG. 5 shows a flow chart for explaining one specific embodiment of the method for exciting a movement of an adjustable part about a rotational axis.

A first oscillating motion of the adjustable part, which is connected to a mounting at least via springs, is excited, in relation to the mounting, about a first rotational axis oriented perpendicularly with respect to the rotational axis in a method step S10. At the same time as method step S11, a second oscillating motion of the adjustable part that is set into the first oscillating motion is excited, in relation to the mounting, about a second rotational axis oriented at an angle with respect to the first rotational axis and perpendicularly with respect to the rotational axis in such a way that the adjustable part is adjusted about the rotational axis with the aid of a torque that results from an excitation of the adjustable part, set into the first oscillating motion, into the second oscillating motion.

The adjustable part is set, in relation to the mounting, into the first oscillating motion about the first rotational axis (method step S10) and/or into the second oscillating motion about the second rotational axis (method step S11) by deformation of a first piezoelectric bending actuator, a second piezoelectric bending actuator, a third piezoelectric bending actuator, and a fourth piezoelectric bending actuator, of which each of the four piezoelectric bending actuators at its first end is anchored to the mounting, while the adjustable part is suspended, at least via the springs, on the four piezoelectric bending actuators.

What is claimed is:

1. A micromechanical component, comprising:
   a mounting;
   an adjustable part that is connected, at least via springs, to the mounting; and
   an actuator device that is configured so that a first oscillating motion of the adjustable part is excitable, in relation to the mounting, about a first rotational axis with the actuator device, and at the same time a second oscillating motion of the adjustable part, set into the first oscillating motion, is excitable, in relation to the mounting, about a second rotational axis, oriented at an angle with respect to the first rotational axis, with the actuator device;
   wherein the actuator device includes a first piezoelectric bending actuator, a second piezoelectric bending actuator, a third piezoelectric bending actuator, and a fourth piezoelectric bending actuator, and wherein the adjustable part is settable, in relation to the mounting, into the first oscillating motion about the first rotational axis and/or into the second oscillating motion about the second rotational axis by deformation of the four piezoelectric bending actuators,
   wherein each of the four piezoelectric bending actuators at its first end is anchored to the mounting, and wherein the adjustable part is suspended, at least via the springs, on the four piezoelectric bending actuators,
   wherein the first rotational axis is disposed wholly in a first plane that is a cross-sectional area of the micromechanical component that contains the mounting, the adjustable part, and the actuator device, and wherein the second rotational axis is perpendicular to the first plane and intersects the first plane at only a single point of the first plane.

2. The micromechanical component of claim 1, wherein the adjustable part is suspended, at least via the springs, on the four piezoelectric bending actuators so that the adjustable part is adjustable, in relation to the mounting, about a rotational axis that is oriented perpendicularly with respect to the first rotational axis and perpendicularly with respect to the second rotational axis, with the aid of a torque that results from an excitation of the adjustable part, set into the first oscillating motion, into the second oscillating motion.

3. The micromechanical component of claim 2, wherein the actuator device is configured so that the adjustable part is settable into a first resonant oscillating motion as the first oscillating motion, and at the same time is settable into a second resonant oscillating motion as the second oscillating motion, so that the adjustable part is settable into a static oscillating motion about the rotational axis with the resulting torque.

4. The micromechanical component of claim 2, wherein the first piezoelectric bending actuator and the second piezoelectric bending actuator extend in succession along a first axis oriented in parallel to the rotational axis, and the third piezoelectric bending actuator and the fourth piezoelectric bending actuator extend in succession along a second axis oriented in parallel to the rotational axis, and the adjustable part and the springs being situated between the first axis and the second axis.

5. The micromechanical component of claim 1, wherein the adjustable part includes a mirror plate having a reflective surface, and the adjustable part being settable into the first oscillating motion about the first rotational axis, oriented perpendicularly with respect to the reflective surface, and at the same time being settable into the second oscillating motion, or being settable into the first oscillating motion and at the same time being settable into the second oscillating motion about the second rotational axis oriented perpendicularly with respect to the reflective surface.

6. The micromechanical component of claim 1, wherein the micromechanical component includes at least one inner spring, at least one intermediate spring, and four outer springs as the springs, and the adjustable part is connected, at least via the at least one inner spring, to an inner intermediate frame, the inner intermediate frame is connected, at least via the at least one intermediate spring, to an outer intermediate frame, and the outer intermediate frame is suspended, via the four outer springs, on the four piezoelectric bending actuators.

7. The micromechanical component of claim 1, wherein the actuator device also includes at least one further piezoelectric bending actuator that is attached to the adjustable part, to the inner intermediate frame, and/or to the outer intermediate frame, and the adjustable part being settable into the first oscillating motion about the first rotational axis by deformation of the four piezoelectric bending actuators in relation to the mounting, and being settable, into the second oscillating motion about the second rotational axis by deformation of the at least one further piezoelectric bending actuator or being settable, into the first oscillating motion about the first rotational axis by deformation of the at least one further piezoelectric bending actuator, and being settable into the second oscillating motion about the second rotational axis by deformation of the four piezoelectric bending actuators.

8. The micromechanical component of claim 1, wherein the adjustable part is settable, in relation to the mounting, into the first oscillating motion about the first rotational axis and into the second oscillating motion about the second rotational axis by deformation of the four piezoelectric bending actuators.

9. A method for manufacturing a micromechanical component, the method comprising:

connecting an adjustable part, at least via springs, to a mounting; and forming an actuator device configured to excite, in relation to the mounting, a first oscillating motion of the adjustable part about a first rotational axis, and for simultaneously exciting, in relation to the mounting, a second oscillating motion of the adjustable part, set into the first oscillating motion, about a second rotational axis that is oriented at an angle with respect to the first rotational axis, the actuator device being equipped with a first piezoelectric bending actuator, a second piezoelectric bending actuator, a third piezoelectric bending actuator, and a fourth piezoelectric bending actuator that are configured so that the adjustable part is set, in relation to the mounting, into the first oscillating motion about the first rotational axis and/or into the second oscillating motion about the second rotational axis by deformation of the four piezoelectric bending actuators;

wherein each of the four piezoelectric bending actuators at its first end is anchored to the mounting, and the adjustable part is suspended, at least via the springs, on the four piezoelectric bending actuators, wherein the first rotational axis is disposed wholly in a first plane that is a cross-sectional area of the micromechanical component that contains the mounting, the adjustable part, and the actuator device, and wherein the second rotational axis is perpendicular to the first plane and intersects the first plane at only a single point of the first plane.

10. A method for exciting a movement of an adjustable part about a rotational axis, the method comprising:

exciting, in relation to the mounting, a first oscillating motion of the adjustable part, connected at least via springs to a mounting, about a first rotational axis oriented perpendicularly with respect to the rotational axis; and simultaneously exciting, in relation to the mounting, a second oscillating motion of the adjustable part, set into the first oscillating motion, about a second rotational axis oriented at an angle with respect to the first rotational axis and perpendicularly with respect to the rotational axis, so that the adjustable part is adjusted about the rotational axis with a torque that results from an excitation of the adjustable part, set into the first oscillating motion, into the second oscillating motion;

wherein the adjustable part is set, in relation to the mounting, into the first oscillating motion about the first rotational axis and/or into the second oscillating motion about the second rotational axis by deformation of a first piezoelectric bending actuator, a second piezoelectric bending actuator, a third piezoelectric bending actuator, and a fourth piezoelectric bending actuator, of which each of the four piezoelectric bending actuators at its first end is anchored to the mounting, and the adjustable part is suspended, at least via the springs, on the four piezoelectric bending actuators, wherein the first rotational axis is disposed wholly in a first plane that is a cross-sectional area of the micromechanical component that contains the mounting, the adjustable part, and the actuator device, and
wherein the second rotational axis is perpendicular to the first plane and intersects the first plane at only a single point of the first plane.

\* \* \* \* \*